(12) United States Patent  (10) Patent No.: US 9,116,214 B2
Yang et al.  (45) Date of Patent: Aug. 25, 2015

(54) RF COIL ARRAY HAVING TWO OR MORE SWITCHES BUILT WITHIN EACH RF COIL ARRAY ELEMENT, COMPATIBLE WITH BOTH MAGNETIC RESONANCE AND A TEMPERATURE MAPPING

(75) Inventors: Xing Yang, Hartsdale, NY (US); Teck Beng Desmond Yeo, Clifton Park, NY (US); Xu Chu, Shanghai (CN); Thomas Kwok-Fah Foo, Clifton Park, NY (US); Jing Wu, Boston, MA (US)

(73) Assignee: General Electric Company, Niskayuna, NY (US)

( * ) Notice: Subject to any disclaimer, the term of this patent is extended or adjusted under 35 U.S.C. 154(b) by 1056 days.

(21) Appl. No.: 13/149,760

(22) Filed: May 31, 2011

(65) Prior Publication Data

US 2012/0306494 A1  Dec. 6, 2012

(51) Int. Cl.
*G01R 33/3415* (2006.01)
*G01R 33/36* (2006.01)
*G01R 33/48* (2006.01)

(52) U.S. Cl.
CPC ........ *G01R 33/3664* (2013.01); *G01R 33/4808* (2013.01); *G01R 33/3415* (2013.01); *G01R 33/4804* (2013.01)

(58) Field of Classification Search
USPC .......................... 324/300–322; 600/407–435; 382/128–131
See application file for complete search history.

(56) References Cited

U.S. PATENT DOCUMENTS

| 2,658,679 | A | * | 11/1953 | Holbrook et al. | ............. | 235/414 |
|---|---|---|---|---|---|---|
| 3,532,965 | A | * | 10/1970 | Ruban | ............. | 324/316 |
| 5,097,844 | A | | 3/1992 | Turner | | |
| 5,284,144 | A | | 2/1994 | Delannoy et al. | | |
| 5,462,055 | A | * | 10/1995 | Casey et al. | ............. | 600/411 |
| 5,492,122 | A | | 2/1996 | Button et al. | | |
| 7,091,721 | B2 | * | 8/2006 | Jevtic | ............. | 324/318 |
| 7,565,207 | B2 | | 7/2009 | Turner et al. | | |
| 7,663,556 | B2 | * | 2/2010 | Desclos et al. | ............. | 343/702 |
| 7,696,932 | B2 | * | 4/2010 | Desclos et al. | ............. | 343/702 |
| 7,800,368 | B2 | * | 9/2010 | Vaughan et al. | ............. | 324/318 |
| 8,170,643 | B2 | * | 5/2012 | Turner et al. | ............. | 600/411 |
| 2002/0101241 | A1 | * | 8/2002 | Chui | ............. | 324/319 |
| 2002/0169374 | A1 | * | 11/2002 | Jevtic | ............. | 600/422 |
| 2005/0251233 | A1 | | 11/2005 | Kanzius | | |
| 2007/0229372 | A1 | * | 10/2007 | Desclos et al. | ............. | 343/702 |
| 2007/0229376 | A1 | * | 10/2007 | Desclos et al. | ............. | 343/718 |
| 2008/0086050 | A1 | | 4/2008 | Misic et al. | | |
| 2008/0129298 | A1 | * | 6/2008 | Vaughan et al. | ............. | 324/322 |
| 2008/0228063 | A1 | * | 9/2008 | Turner et al. | ............. | 600/411 |
| 2011/0301450 | A1 | * | 12/2011 | Hue et al. | ............. | 600/411 |
| 2012/0306494 | A1 | * | 12/2012 | Yang et al. | ............. | 324/318 |

FOREIGN PATENT DOCUMENTS

WO  91/07132 A1  5/1991
WO  03/002199 A3  9/2003

* cited by examiner

*Primary Examiner* — Melissa Koval
*Assistant Examiner* — Tiffany Fetzner
(74) *Attorney, Agent, or Firm* — Melissa K. Dobson

(57) ABSTRACT

A system including a plurality of coil elements is provided. Each coil element is arranged with a first switch and a second switch. In a first mode, the first switch and the second switch are turned off to split each coil element into a first upper coil portion and a second lower coil portion, to transmit first radio frequency signals. In a second mode, the first switch and second switch are turned on to transform each coil element into a loop coil to simultaneously transmit or receive multiple second radio frequency signals.

20 Claims, 12 Drawing Sheets

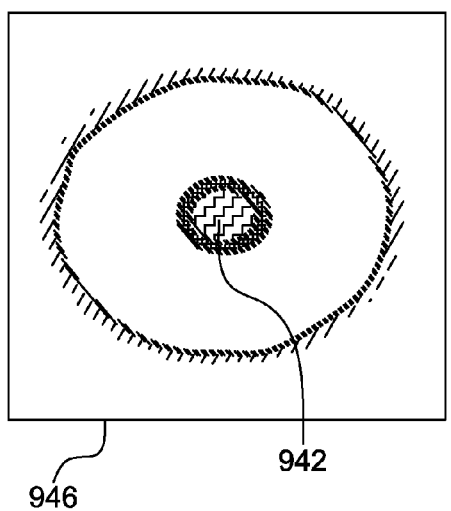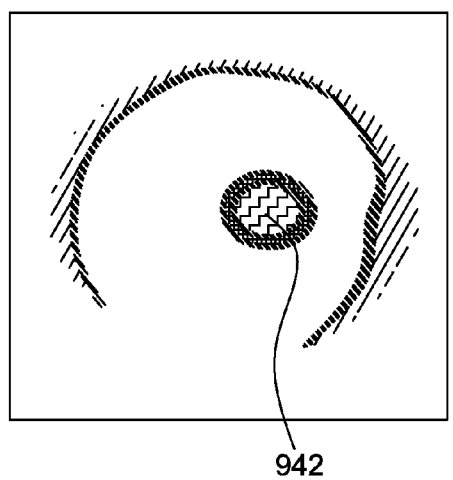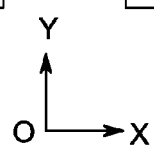
FIG. 10a  FIG. 10b

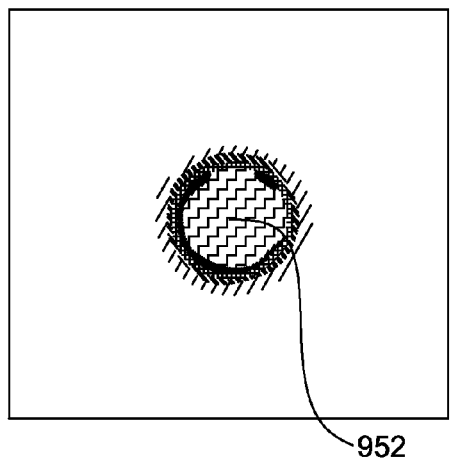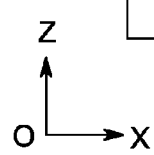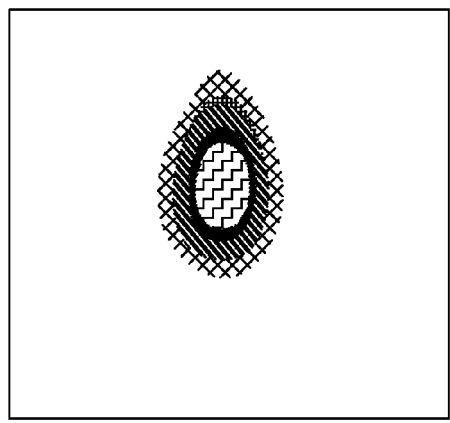
FIG. 11a		FIG. 11b

RF COIL ARRAY HAVING TWO OR MORE SWITCHES BUILT WITHIN EACH RF COIL ARRAY ELEMENT, COMPATIBLE WITH BOTH MAGNETIC RESONANCE AND A TEMPERATURE MAPPING

BACKGROUND

Many clinical studies have shown the effectiveness of adjuvant hyperthermia when it is used in conjunction with radiotherapy and chemotherapy for cancer treatment. Increased tumor cell kill-rate is attained when the temperature in a tumor remains within 41° C. to 43° C. for a predefined period of time, while safety considerations require that the temperature of normal healthy tissue remains below some predetermined limit. In hyperthermia treatment, it is therefore necessary to control the temperature throughout the heated volume. Temperatures can be measured by invasive means, such as thermocouples, thermistors, or fiber-optic probes. However, only regions in close proximity to the probes can be monitored with these technologies, and thus, spatial sampling density of temperature is low. Furthermore, probe insertion may be painful and hazardous.

Magnetic resonance (MR) is a non-invasive and non-ionizing technique, which may produce anatomical images in any orientation. In addition, temperature measurements can be obtained by means of magnetic resonance imaging. However, conventional MR systems are not designed to accommodate hyperthermia systems. It is very challenging to combine hyperthermia and MR functions in a system by simply placing conventional RF hyperthermia apparatus inside a standard MR scanner. Significant changes are typically required for both systems to avoid crosstalk and degraded MR thermometry data, which may significantly affect the ability to track the thermal dose delivered.

For these and other reasons, there is a need for embodiments of the present invention.

BRIEF DESCRIPTION

In accordance with one or more embodiments disclosed herein, system and method are provided. One exemplary system provided includes a plurality of coil elements. Each coil element is arranged with a first switch and a second switch built into each of the plurality of RF coil elements. In a first mode, the first switch and the second switch are turned off to split each coil element into a first upper coil portion and a second lower coil portion, to transmit first radio frequency signals. In a second mode, the first switch and second switch are turned on to transform each coil element into a loop coil to simultaneously transmit or receive multiple second radio frequency signals.

DRAWINGS

These and other features, aspects, and advantages of embodiments of the present disclosure will become better understood when the following detailed description is read with reference to the accompanying drawings in which like characters represent like parts throughout the drawings, wherein:

FIGS. 10a and 10b illustrates Specific Absorption Rate (SAR) steering capability in the X-Y coordinate plane by operating the coil assembly shown in FIG. 8 in accordance with an exemplary embodiment of the present disclosure.

FIGS. 11a and 11b illustrates SAR steering capability in the Z-X coordinate plane by operating the coil assembly shown in FIG. 8 in accordance with an exemplary embodiment of the present disclosure.

DETAILED DESCRIPTION

Figure 1:
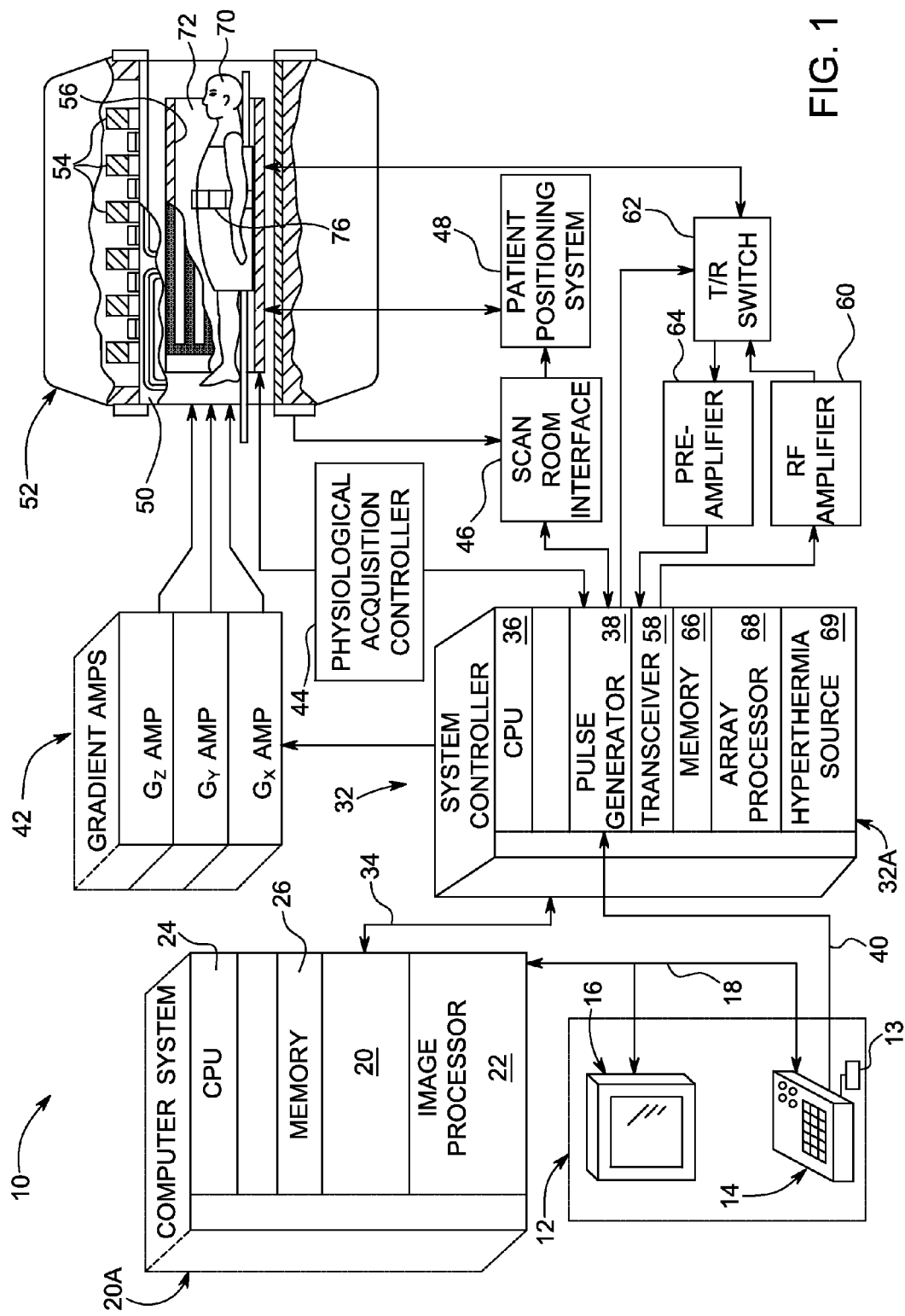
FIG. 1 is a schematic block diagram of an exemplary magnetic resonance system in accordance with one embodiment of the present disclosure.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The use of "including", "comprising", or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect.

As discussed in detail below, embodiments of the present disclosure generally relates to a magnetic resonance (MR) system integrated with hyperthermia functions. More specifically, the MR system is provided with a particularly designed coil assembly. The coil assembly may be switched to operate at least in a first mode and a second mode. The first mode may be a hyperthermia mode, in which the coil assembly may be configured to enable a first function of hyperthermia treatment of a region of interest by irradiating radio frequency energies to the region of interest. The second mode may be a MR mode, in which the same coil assembly may be transformed to enable a second function of temperature monitoring of the region of interest by transmitting or receiving radio frequency signals. Compared to conventional combination of a hyperthermia system and a MR system to get a hybrid system, using a single coil assembly with different operating modes may more effectively enable a MR system to provide hyperthermia functions. Because the coil assembly is switched to perform the hyperthermia functions and the MR thermometry functions, at least the problem of crosstalk between the hyperthermia system and the MR system is minimized or eliminated. Moreover, in some embodiments, the new coil assembly design enables contemporaneous heating and parallel imaging. The signal to noise ratio (SNR) is typically increased by placing the coil assembly closer to the body and the acquisition speed of MR thermometry can be increased by parallel imaging.

For ease of explanation, an overall MR system will first be described.

Turning now to the figures, FIG. 1 is a schematic block diagram of an exemplary magnetic resonance (MR) system in accordance with an embodiment. The operation of MR system 10 is controlled from an operator console 12 that includes an input device 13, a control panel 14, and a display 16. The operator console 12 communicates through a link 18 with a computer system 20 and provides an interface for an operator to prescribe MR scans, display resultant images, perform image processing on the images, and archive data and images. The input device 13 may include a mouse, joystick, keyboard, track ball, touch activated screen, light wand, voice control, or any similar or equivalent input device, and may be used for interactive geometry prescription.

The computer system 20 includes a number of modules that communicate with each other through electrical and/or data connections, for example, such as are provided by using a backplane 20A. Data connections may be wired links or wireless communication links or the like. The modules of the computer system 20 may include an image processor module 22, a CPU module 24, and a memory module 26. The memory module 26 may include a frame buffer for storing image data arrays. The memory module 26 includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the image data arrays. In an alternative embodiment, the image processor module 22 may be replaced by image processing functionality on the CPU module 24. The computer system 20 may be linked to archival media devices, permanent or back-up memory storage or a network. The computer system 20 may also communicate with a separate system control computer 32 through a link 34.

The system control computer 32 in one aspect includes a set of modules in communication with each other via electrical and/or data connections 32A. Data connections 32a may be wired links or wireless communication links or the like. In alternative embodiments, the modules of computer system 20 and system control computer 32 may be implemented on the same computer system or a plurality of computer systems. The modules of system control computer 32 may include a CPU module 36 and a pulse generator module 38 that connects to the operator console 12 through a communications link 40.

The pulse generator module 38 in one example is integrated into the scanner equipment (e.g., resonance assembly 52). It is through link 40 that the system control computer 32 receives commands from the operator to indicate the scan sequence that is to be performed. The pulse generator module 38 operates the system components that perform the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to the gradient amplifier system 42 that is comprised of Gx, Gy, and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit mode or receive mode.

The MR signals sensed by the RF coil 56 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on the display 16. The system control computer 32 further includes a hyperthermia source for generating hyperthermia RF signals.

Figure 2:
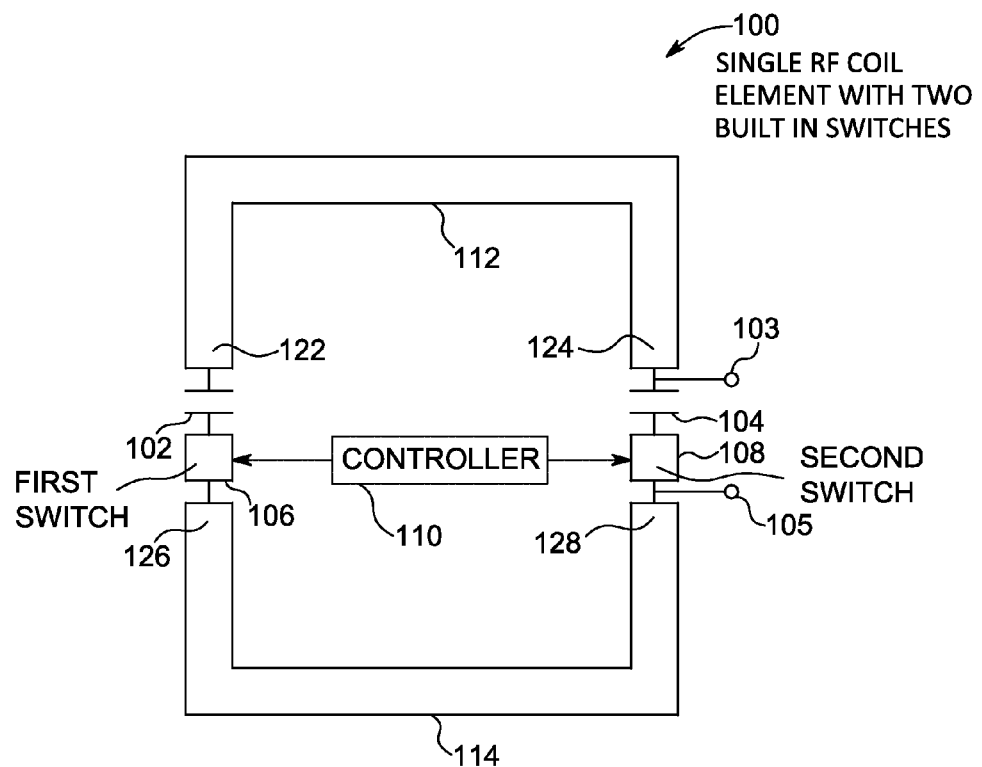
FIG. 2 is a schematic diagram of an exemplary coil element for use in the MR system illustrated in FIG. 1 in accordance with one embodiment of the present disclosure.

FIG. 2 illustrates an exemplary configuration of a coil element 100 for use in an MR system, such as that shown in FIG. 1. As used herein, the term "coil" may also be called antenna or similar terms for radio frequency signal transmission and reception. In general, the coil element 100 is capable of being transformed to have a first coil configuration or a second coil configuration so as to enable hyperthermia function and MR thermometry function of the MR system 10. With the transformed first coil configuration, first radio frequency (RF) signals can be radiated from the coil element 100 to a target or a region of interest to heat the region of interest. With the transformed second coil configuration, second radio frequency signals can be transmitted from the coil element 100 or received by the coil element 100 for facilitating magnetic resonance MR imaging of the region of interest, such that temperature of the target or the region of interest can be detected through MR imaging. In one implementation, the frequency of the first RF signals is the same as the frequency of the second RF signals. In another implementation, the frequency of the first RF signals may be different from the frequency of the second RF signals.

In one implementation, the coil array arrangement structurally comprises a plurality of individual coil elements. The physical switches are built into each of the individual coil elements and are responsible for effectively splitting each coil element into an upper coil portion and a lower coil portion Each individual coil element comprising a first switch directly connected to a first capacitor and a second switch directly connected to a second capacitor; wherein each of the first and second switching capacitor structures are built into each of the individual coil elements; the first and the second switch built into the coil elements in a way in which each first and the second switch and capacitor structure effectively separates or divides each individual coil element (or coil arrangement) structurally into an array of individual coil elements each having an upper coil portion and a lower coil portion. The upper coil portion and the lower coil portion of each coil element are distinguished by at least the first switch element with the first capacitor and at least the second switch element with the second capacitor. As shown in FIG. 2, the coil element 100 includes a first upper coil portion 112 and a second lower coil portion 114 that are selectively coupled to each other via switches. Although two coil portions 112 and 114 are illustrated for description purposes, it is contemplated that the coil element 100 may be designed to include multiple coil portions. More specifically, in one implementation, a first end 122 of the first upper coil portion 112 is electrically coupled to a first end 126 of the second lower coil portion 114 via a first switch 106, and a second end 124 of the first upper coil portion 112 is electrically coupled to a second end 128 of the second lower coil portion 114 via a second switch 108. The first switch 106 and the second switch 108 are built into each of the plurality of RF coil elements and can be turned on or off in response to control signals issued from a controller 110. As used herein, the term "switch" refers to an electronic component that can be used to connect or disconnect two or more electronic components in electrical connection with the switch. The mechanism of operation of such switches may be electrical, or it may be mechanical, or it may be chemical, or it might be a combination of the above. In addition, the switch can be a single electronic switch (e.g., diode, BJT or MOSFET), or a circuit that functions essentially as an electric switch having at least two states of distinct impedance. In one implementation, the first switch 106 and the second switch 108 are built into each of the plurality of RF coil elements and may be any appropriate switches used for radio frequency circuit switching.

In general, in order to achieve the dual functions of hyperthermia and MR thermometry, the first upper coil portion 112 and the second lower coil portion 114 are designed to have a non-linear shape. Specifically, in one implementation, as shown in FIG. 2, the first upper coil portion 112 and the second lower coil portion 114 are illustrated to be strips having a semi-rectangular shape. Each of the two coil portions 112, 114 may be cut from a complete rectangular shape. In this example, the first upper coil portion 112 is illustrated to be a single strip continually extending between the first end 122 and the second end 124, i.e., the first upper coil portion 112 has two parallel extending strips and a straight strip interconnecting between the two parallel extending strips. It should be understood, in alternative embodiments, the first upper coil portion 112 may comprise multiple strip elements connected between the first end 122 and the second end 124, and the multiple strip elements may be coupled together via one or more intermediate elements. The material used to make the first upper coil portion 112 and the second lower coil portion 114 can be selected based on practical requirements. In one implementation, as a non-limiting example, copper or copper-containing material having low loss and low cost may be used to make the first upper coil portion 112 and the second lower coil portion 114.

With continuing reference to FIG. 2, in one implementation, the coil element 100 may further comprise a loop capacitor 102 coupled between the first upper coil portion 112 and the second lower coil portion 114. More specifically, one terminal of the loop capacitor 102 is coupled to the first end 122 of the first upper coil portion 112, and the other terminal of the loop capacitor 102 is coupled to one terminal of the first switch 106. The loop capacitor 102 is provided for tuning resonance frequency of the coil element 100 in MR imaging. It should be understood that, in alternative embodiment, the loop capacitor 102 may also be placed in electrical connection with one terminal of the first switch 106 and the first end 126 of the second lower coil portion 114.

With continuing reference to FIG. 2, in one implementation, the coil element 100 may further comprise an impedance matching capacitor 104 coupled between the first upper coil portion 112 and the second lower coil portion 114. In one implementation, the impedance matching capacitor 104 is placed in a position adjacent to the two terminals, 103 and 105, of the input port. More specifically, one terminal of the impedance matching capacitor 104 is coupled to the second end 124 of the first upper coil portion 112, and the other terminal of the impedance matching capacitor 104 is coupled to one terminal of the second switch 108. The impedance matching capacitor 104 is provided to ensure that the impedance looking into the coil element 100 from the input port terminals 103, 105 matched with the impedance of a signal transmission line. In one implementation, when a coaxial cable is used to transmit the input signals to the coil element 100, the impedance matching capacitor 104 can be adjusted to ensure the impedance looking into the coil element 100 from the input ports 103, 105 to be 50 ohms, for example. However, the impedance matching capacitor 104 can be adjusted to ensure any suitable impedance looking into the coil element 100 as necessary for the application. It should be understood that, in alternative embodiment, the impedance matching capacitor 104 may also be placed in electrical connection with one terminal of the second switch 108 and the second end 128 of the second lower coil portion 114.

Figure 3:
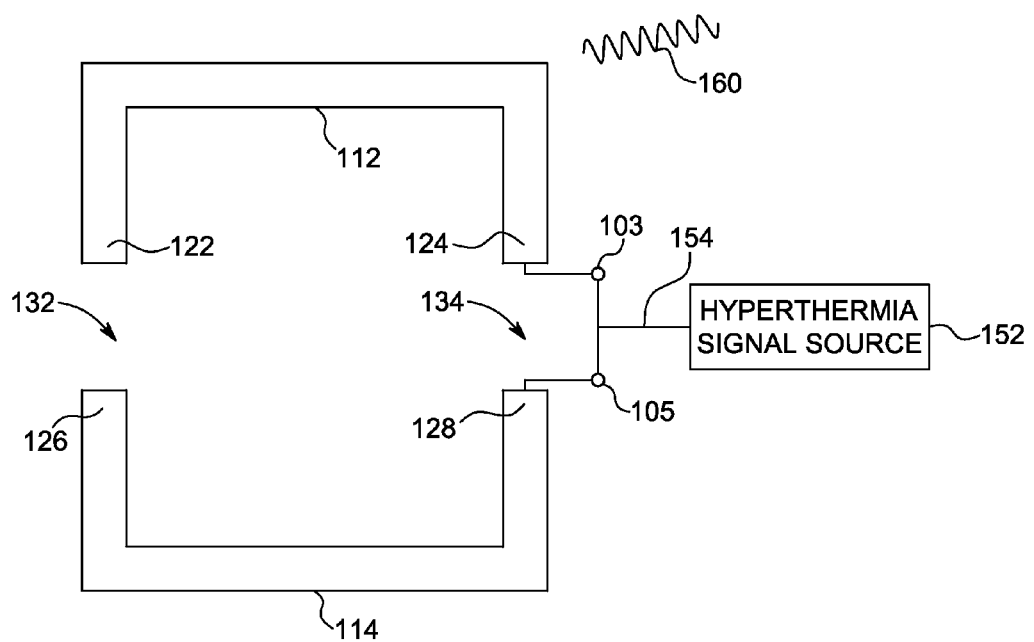
FIG. 3 is a simplified schematic diagram of the coil element 100 illustrated in FIG. 2 in combination with other elements of the MR system illustrated in FIG. 1, where the coil element 100 operates in a hyperthermia mode in accordance with one embodiment of the present disclosure.

FIG. 3 illustrates a simplified diagram of the coil element 100 shown in FIG. 2 working in a hyperthermia or heating mode (simply referred to as heating mode). In the heating mode, the first switch 106 and the second switch 108 (i.e. built into each of the plurality of RF coil elements) shown in FIG. 2 are turned off in response to control signals transmitted from the controller 110. As shown in FIG. 3, due to the off state first switch 106, the loop capacitor 102 can be viewed as being removed from the coil element 100 and an open circuit area 132 is formed between the first end 122 of the first upper coil portion 112 and the first end 126 of the second lower coil portion 114. Likewise, due to the off state second switch 108, the impedance matching capacitor 104 can also be viewed as being removed from the coil element 100, and an open circuit area 134 is formed between the second end 124 of the first upper coil portion 112 and the second end 128 of the second lower coil portion 114. Thus, the first upper coil portion 112 and the second lower coil portion 114 are disconnected from each other. With the disconnected coil portions 112 and 114, input RF signal 154 provided from a hyperthermia signal source 152 can be applied to the coil element 100 via the input port terminals 103 and 105. The coil element 100 radiates first radio frequency (RF) signals 160 in response to the input RF signals 154. The input RF signals 154 provided from the hyperthermia signal source 152 may be in a frequency range of 40 to 1000 MHz. In some implementations for deep region heating, the frequency range may be selected between 100 to 250 MHz. In a specific embodiment, as a non-limiting example, the frequency of the input RF signals 154 may be 127.24 MHz. The frequency range can be set as appropriate for the application. Although not illustrated, it should be understood that, in some embodiments, the input RF signals 154 may be amplified by an amplifier to have appropriate amplitude for RF radiation. The input RF signals 154 may also be subjected to phase shifts for hot spot steering when multiple coil elements are constructed with the same structure of the coil element 100.

Figure 4:
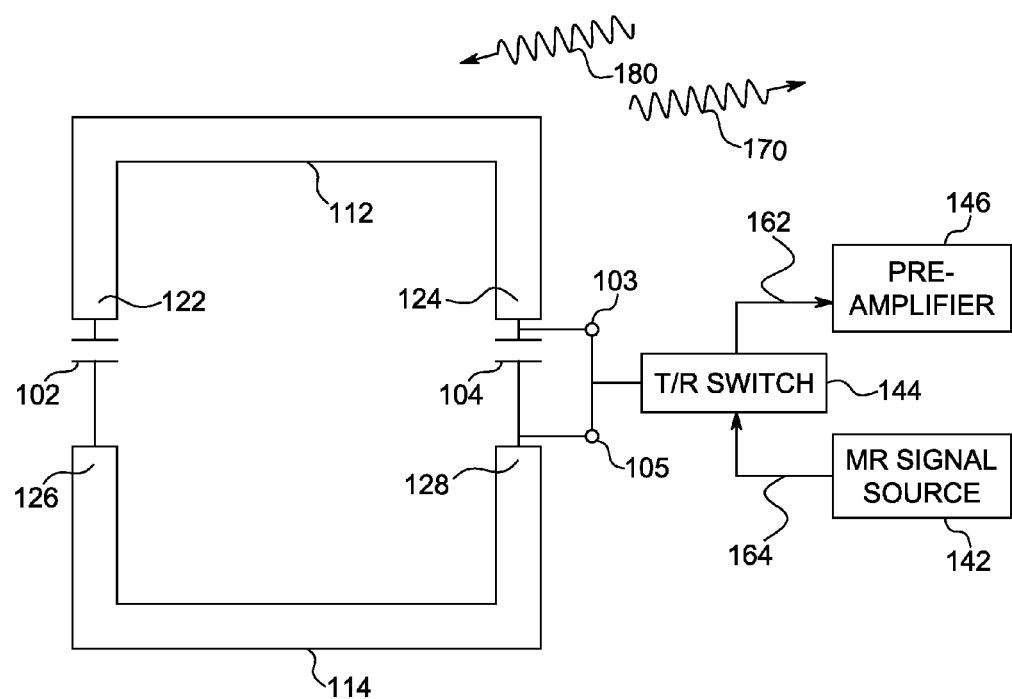
FIG. 4 is another simplified schematic diagram of the coil element 100 illustrated in FIG. 2 in combination with other elements of the MR system illustrated in FIG. 1, where the coil element 100 operates in a MR mode in accordance with one embodiment of the present disclosure.

FIG. 4 illustrates a simplified diagram of the coil element 100 working in a MR imaging mode. In the MR imaging mode, the first switch 106 and the second switch 108 are turned on. As a result, the first upper coil portion 112 and the second lower coil portion 114 are electrically coupled together via the loop capacitor 102 and the impedance matching capacitor 104 to form a loop coil. With the loop coil formed by the coil element 100, input RF signals 164 provided from the MR signal source 142 is applied to the coil element 100 via the terminals input ports. The coil element 100 then transmits second RF signals 170 in response to the input signals 164 provided from the MR signal source 142. The second RF signals 170 are used to excite the nuclear spins of the imaged region of interest. The exited RF signals 180 from the exited nuclei of the imaged region of interest can be picked up by the coil element 100. The coil element 100 presents received RF signals 162 to a preamplifier 146 via a transmit/receive switch (T/R switch) 144, to be amplified and further processed to derive MR images and resultant temperature of the region of interest.

As described above in reference to FIGS. 3 and 4, the input RF signals 154 for hyperthermia and the input RF signals 164 for MRI are illustrated to be applied to the coil element 100 via the same terminals 103 and 105 of the same input port. It should be understood that, in alternative embodiment, the input RF signals 164 may be applied to the coil element 100 at other places of the coil element 100. For example, the input RF signals 164 may be applied to the coil element 100 via the two terminals of the loop capacitor 102.

Furthermore, as described above of the coil element 100 in reference to the FIGS. 2-4, the coil element 100 is designed to achieve the dual functions of hyperthermia and MR imaging in the medical field. It should be noted that, the transformable coil element 100 may be used in other applications to achieve other functions.

Figure 5:
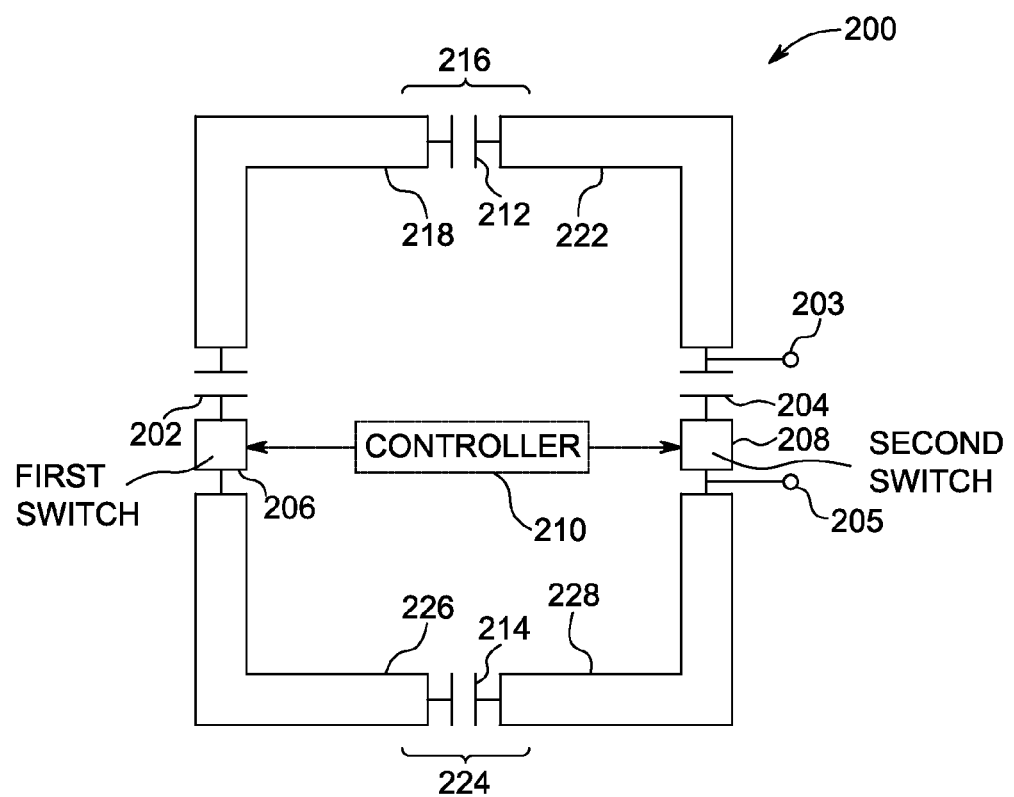
FIG. 5 is a schematic diagram of another exemplary coil element for use in the MR system illustrated in FIG. 1 in accordance with another embodiment of the present disclosure.

FIG. 5 illustrates a schematic diagram of another coil element 200 for use in the MR system 10 shown in FIG. 1 in accordance with an exemplary embodiment. The illustrated coil element 200 has similar structure with respect to the coil element 100 described above. For example, the coil element 200 also includes two switches 206 and 208, a loop capacitor 202, and an impedance matching capacitor 204. Rather than using a singular strip coil portion as that shown in FIG. 2, a first upper coil portion 216 of the coil element 200 includes L-shaped first sub-coil portion 218 and second sub-coil portion 222. The first sub-coil portion 218 and the second sub-coil portion 222 are electrically coupled together by a loop capacitor 212. Similarly, a second lower coil portion 224 of the coil element 200 includes L-shaped third sub-coil portion 226 and fourth sub-coil portion 228. The third sub-coil portion 226 and the fourth sub-coil portion 228 are electrically coupled together by a loop capacitor 214. In one aspect, the loop capacitors 212 and 214 may be used for tuning resonance frequency of the coil element 200 in MR imaging mode. In another aspect, the loop capacitors 212 and 214 can help to distribute the voltage along the closed loop of the coil element 200 in the MR mode, resulting in reduced voltage stress on the loop capacitor 202 and the impedance matching capacitor 204. Thus, potential heat damage issues can be avoided by adding the loop capacitors 212 and 214 in the coil element 200. When the two switches 206 and 208 are turned on in response to control signals from the controller 210, a loop coil is also formed for MR imaging. When the two switches 206 and 208 are turned off, the first upper coil portion 216 and the second lower coil portion 224 are disconnected for RF heating.

Figure 6:
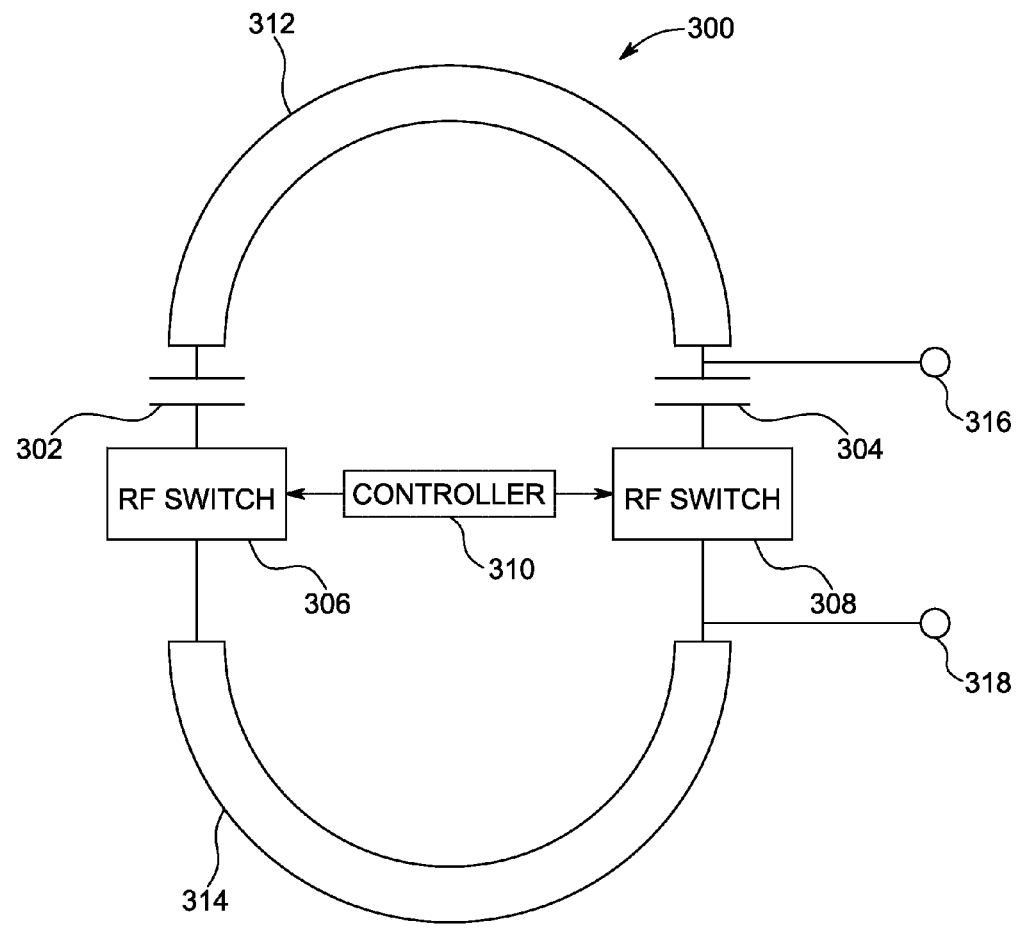
FIG. 6 is a schematic diagram of another exemplary coil element for use in the MR system illustrated in FIG. 1 in accordance with yet another embodiment of the present disclosure.

FIG. 6 illustrates a schematic diagram of yet another coil element 300 for use in the MR system 10 shown in FIG. 1 in accordance with an exemplary embodiment. The coil element 300 is also constructed to have similar structure with respect to the coil elements 100 and 200 described above. For example, the coil element 300 also includes two switches 306 and 308, a loop capacitor 302, and an impedance matching capacitor 304. The coil element 300 further includes a first upper coil portion 312 and a second lower coil portion 314. In this example, the first upper coil portion 312 and the second lower coil portion 314 are provided to be circular in shape.

When the two switches 306 and 308 are turned on in response to control signals from the controller 210, a loop coil is also formed for MR imaging. When the two switches 306 and 308 are turned off, the first upper coil portion 312 and the second lower coil portion 314 are disconnected for RF heating. Although rectangular shaped and circular shaped coil portions are illustrated in FIGS. 2 and 5 respectively for both hyperthermia and MR imaging, it can be contemplated to construct the coil portions to be any appropriate shapes. For example, the coil portions may have a square shape or a polygonal shape or a combination thereof.

Figure 7:
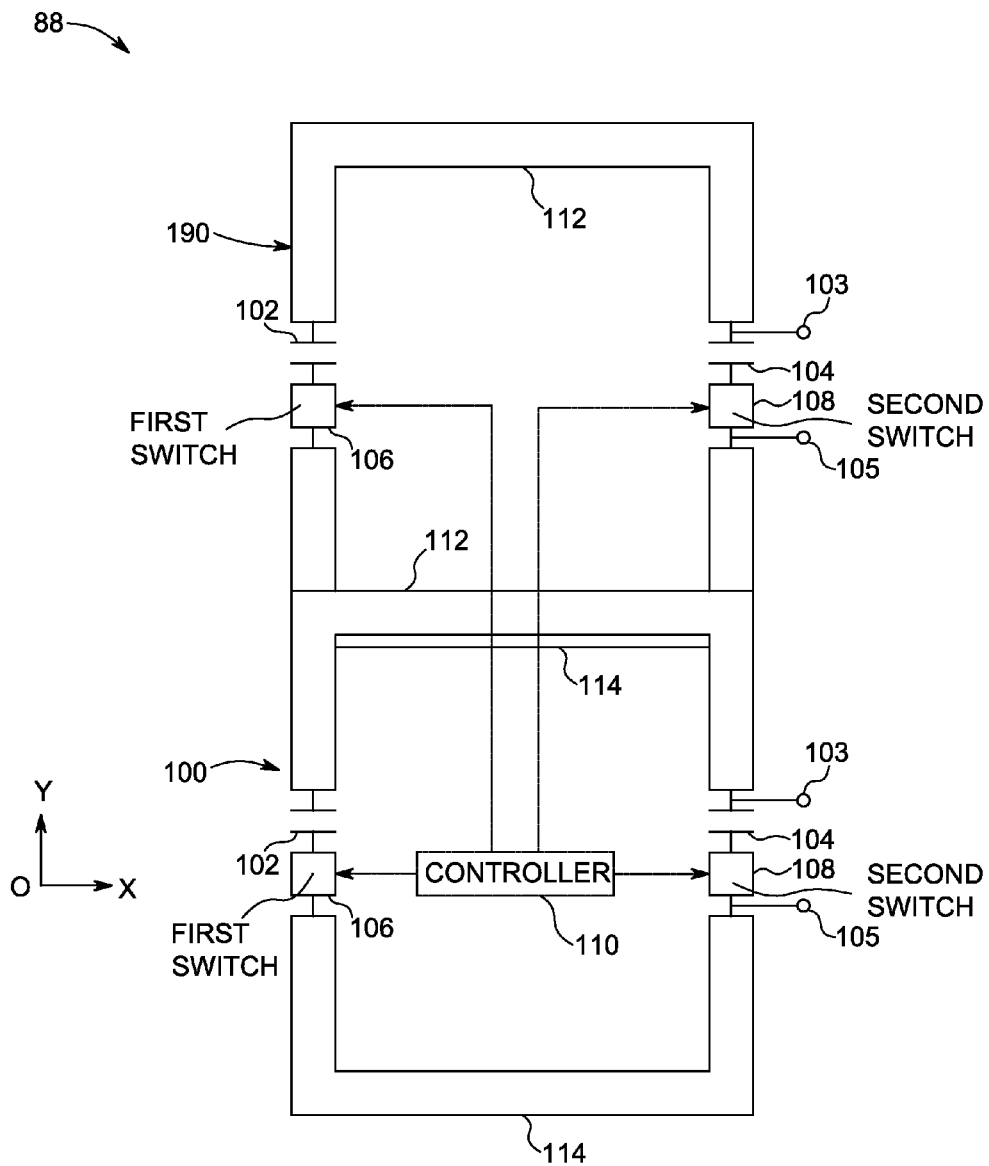
FIG. 7 is a schematic diagram of a coil assembly having two coil elements arranged in overlapped manner for use in the MR system illustrated in FIG. 1 in accordance with an embodiment of the present disclosure.

FIG. 7 illustrates a schematic diagram of a coil assembly 88 for use in the MR system 10 shown in FIG. 1 in accordance with an exemplary embodiment. For description purposes, the coil assembly 88 is illustrated to comprise a first coil element 100 and a second coil element 190. It should be noted that more coil elements could be included in the coil assembly 88. In one implementation, the first coil element 100 and the second coil element 190 are overlapped to reduce undesirable induced signals generated due to mutual inductance between the first coil element 100 and the second coil element 190 during MR imaging. As shown in FIG. 7, the first upper coil portion 112 and the second lower coil portion 114 are aligned in the X axis and separated in the Y axis. Specifically, the first upper coil portion 112 of the first coil element 100 overlaps with the second lower coil portion 114 of the second coil element 190. The overlapped extent of the two coil elements 100 and 190 can be determined based on practical requirements.

In operation of the coil assembly 88 showed in FIG. 7, each of the two coil elements 100 and 190 acts a single channel for RF signal transmission and reception. In the heating mode, each of the two coil elements 100 and 190 are transformed to have at least two separated coil portions by turning off the switches arranged with each coil element. With this coil configuration, the coil elements 100 and 190 individually radiate RF signals to heat a region of interest. In the MR mode, each of the two coil elements 100 and 190 are transformed to a loop coil by turning on the switches arranged with each coil element. With the loop coil configuration, the coil elements 100 and 190 simultaneously transmit or receive radio frequency signals for MR imaging.

Figure 8:
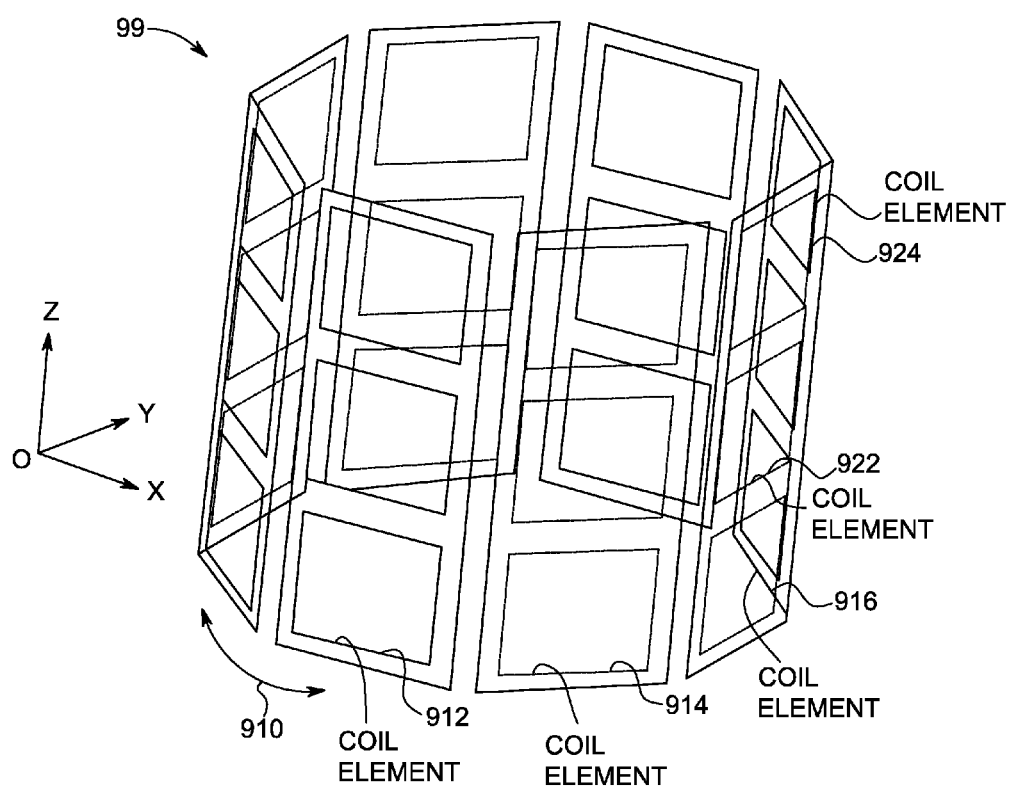
FIG. 8 is a schematic diagram of another coil assembly having multiple coil elements arranged in non-overlapped manner for use in the MR system illustrated in FIG. 1 in accordance with an embodiment of the present disclosure.

FIG. 8 illustrates a schematic diagram of another coil assembly 99 for use in the MR system shown in FIG. 1 in accordance with an exemplary embodiment. The coil assembly 99 includes multiple coil elements 912, 914, 916, 922, and 924 arranged in an array. In particular, the multiple coil elements are arranged in a non-overlapped manner. For example, in the tangential direction 910, the coil elements 912, 914, and 916 are separated from one another. In the Z axis direction, the coil elements 916, 922, and 924 are also separated from one another. In implementation, the coil assembly 99 may be implemented as a head coil, a torso coil, a neck-spine coil, a wrist coil, or a knee coil for use in the MR system 10. Because the loop coil is relatively small in size, the coil elements can be located closer to a subject than a birdcage body coil. Accordingly, during MR imaging, the signal to noise ratio (SNR) can be increased. Furthermore, acquisition speeds of MR imaging can be improved via parallel transmit and/or parallel imaging. As used herein, "parallel transmit" may refer to multiple coil elements driven by individual drivers, and "parallel imaging" may refer to multiple coil elements that receive signals via multiple channels respectively.

In operation of the coil assembly 99 shown in FIG. 8, each of the multiple coil elements 912, 914, 916, 922, and 924 acts as a single channel for RF signal transmission and reception. In the heating mode, each of the multiple coil elements 912, 914, 916, 922, and 924 are transformed to have at least two separated coil portions by turning off the switches arranged with each coil element. With this coil configuration, the multiple coil elements individually radiate RF signals to heat a region of interest.

Figures 9A, 9B:
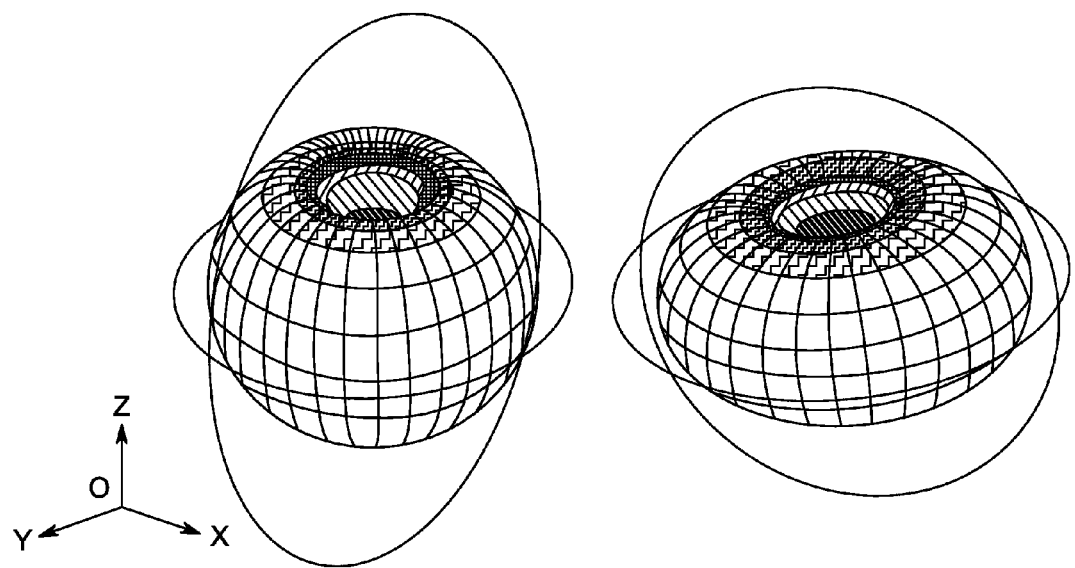
FIG. 9a illustrates EM simulation results of electric field distribution by operating one of the coil elements of the coil assembly shown in FIG. 8 in the hyperthermia mode in accordance with an exemplary embodiment of the present disclosure.
FIG. 9b illustrates EM simulation results of electric field distribution by operating a conventional straight type dipole antenna in the hyperthermia mode.

FIG. 9a illustrates EM simulation results of radiation pattern distributions by operating one of the coil elements of the coil assembly 99. FIG. 9b illustrates EM simulation results of radiation pattern distributions by operating a conventional straight type dipole antenna in the hyperthermia mode. From FIGS. 9a and 9b, it can be seen that the coil element of the coil assembly 99 has a donut-shaped radiation pattern similar to that of the straight dipole antenna.

In one implementation, the phase and magnitude of the RF signals applied to each of the coil elements of the coil assembly 99 can be adjusted to steer focusing spot of the RF energy. FIGS. 10a and 10b illustrates the SAR steering capability of the coil assembly 99 in the X-Y coordinate plane. As shown in FIG. 10a, the focusing spot 942 is initially placed at about the center of a circle 946. After phase shifting and magnitude scaling of the RF signals applied to the multiple coil elements of the coil assembly 99, the focusing spot 942 is moved from the center to right portion of the circle 946. In this regard, a new region of interest can be heated by the RF energy at the new located focusing spot 942.

FIGS. 11a and 11b illustrate the SAR steering capability of the coil assembly 99 in the X-Z coordinate plane. As shown in FIG. 11a, the focusing spot 952 is illustrated to have a circular shape. After phase shifting and magnitude scaling of the RF signals applied to the multiple coil elements of the coil assembly 99, the focusing spot 942 is shaped to be elliptical. In this regard, the region of interest to be heated in changed due to the shape change of the focusing spot 952. It should be understood that, it is possible to achieve steering capability in other coordinate planes by adjusting the input RF signals applied to the multiple coil element with appropriate phases and amplitudes.

Figure 12:
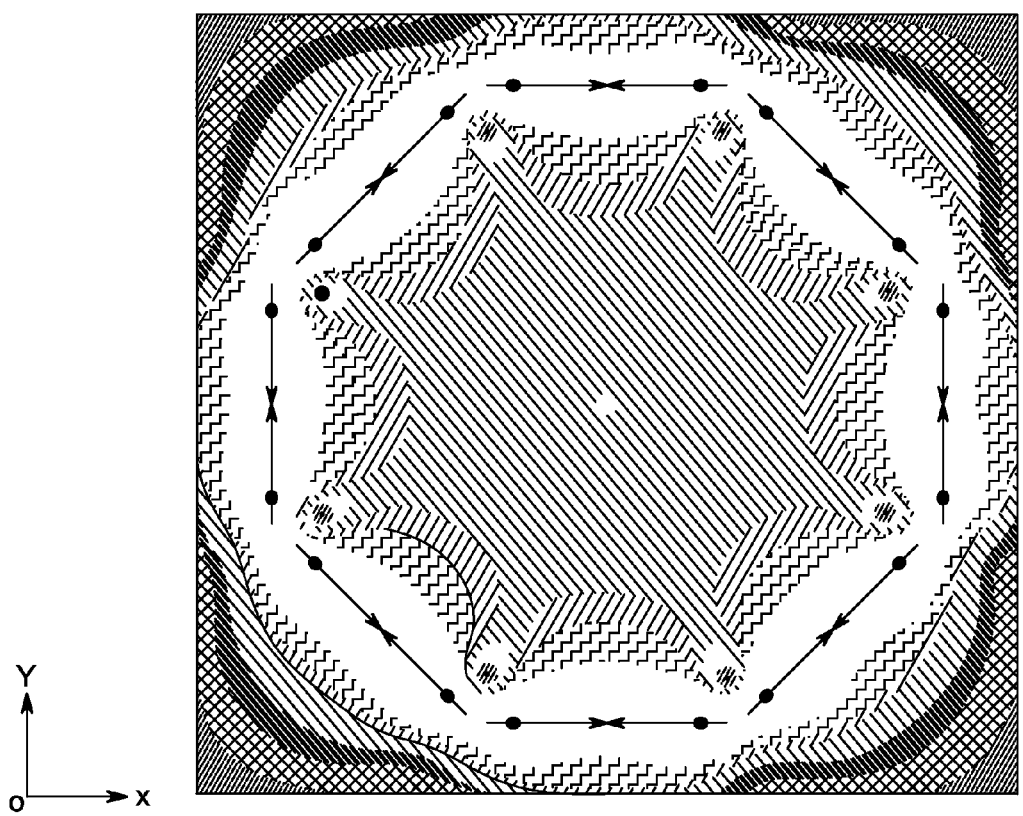
FIG. 12 illustrates EM simulation results of B1 field distribution by operating the coil assembly shown in FIG. 8 in the MR mode in accordance with an exemplary embodiment of the present disclosure.

In operation of the coil assembly 99 in the MR mode, each of the multiple coil elements 912, 914, 916, 922, and 924 are transformed to be loop coil by turning on the switches arranged with each coil element. With the loop coil configuration, the coil elements are capable of simultaneously transmitting or receiving radio frequency signals for MR imaging. The loop coils are driven with RF signals that have independent phases and amplitudes. In one implementation, the amplitudes of the RF signals are identical and the phases are azimuthally distributed. For example, the phase different between adjacent coil elements is 45°. FIG. 12 illustrates EM simulation results of $B_1$ field distribution in the X-Y plane by operating the coil assembly 99 shown in FIG. 8 in the MR mode in accordance with an exemplary embodiment. As shown in FIG. 12, a homogeneous circular polarized $B_1$ field can be achieved when the amplitudes of the input RF signals are identical and the phases are azimuthally distributed.

One person skilled in the art will recognize the interchangeability of various features from different embodiments. The various features described, as well as other known equivalents for each feature, can be mixed and matched by one of ordinary skill in this art to construct additional systems and techniques in accordance with principles of this disclosure.

The invention claimed is:
1. A radio frequency (RF) coil array system that is compatible with magnetic resonance imaging (MRI) comprising:
a plurality of coil elements, each coil element of the plurality of coil elements being functional in transmitting or receiving radio frequency signals, with a first switch and a second switch physically built into each coil element, of the plurality of coil elements, such that a first loop capacitor is connected to the first switch at a first end of a second coil portion, while an impedance matching capacitor is connected to the second switch at a second end of the second coil portion;

wherein one terminal of the first loop capacitor is coupled to a first end of a first coil portion, along with one terminal of the impedance matching capacitor being coupled to a second end of the first coil portion;

wherein in a first mode, the first switch and the second switch are turned off in order to split each coil element, of the plurality of coil elements, into a first coil portion and a second coil portion, the first coil portion and the second coil portion of each coil element, within the plurality of coil elements, thereby transmit first radio frequency signals in the first mode; and wherein in a second mode, the first switch and second switch are turned on in order to transform each coil element, of the plurality of coil elements into a loop coil, and the loop coils that have been transformed from the plurality of coil elements, then operate in order to simultaneously transmit or receive multiple second radio frequency signals, as part of the second mode.

2. The radio frequency (RF) coil array system of claim 1, wherein each coil element, of the plurality of coil elements, further comprises:

the first loop capacitor being coupled in series with the first switch, whereby the first loop capacitor and the first switch are electrically coupled between a first end of the first coil portion and a first end of the second coil portion;

wherein when the first switch is turned on, the first end of the first coil portion is electrically coupled to the first end of the second coil portion via the first loop capacitor; and wherein when the first switch is turned off, the first end of the first coil portion is electrically disconnected from the first end of the second coil portion.

3. The radio frequency (RF) coil array system of claim 1, wherein each coil element, of the plurality of coil elements, further comprises:

the impedance matching capacitor being coupled in series with the second switch, whereby the impedance matching capacitor and the second switch are electrically coupled between a second end of the first coil portion and a second end of the second coil portion;

wherein when the second switch is turned on, the second end of the first coil portion is electrically coupled to the second end of the second coil portion via the impedance matching capacitor; and wherein when the second switch is turned off, the second end of the first coil portion is electrically disconnected from the second end of the second coil portion.

4. The radio frequency (RF) coil array system of claim 1, wherein the first coil portion comprises:

a first sub-coil portion and a second sub-coil portion, while the second coil portion comprises:
a third sub-coil portion and a fourth sub-coil portion;
wherein each coil element, of the plurality of coil elements, further comprises:
a second loop capacitor electrically coupled between the first sub-coil portion and the second sub-coil portion; and
a third loop capacitor electrically coupled between the third sub-coil portion and the fourth sub-coil portion.

5. The radio frequency (RF) coil array system of claim 1, wherein the first coil portion and the second coil portion are each constructed in order to have a non-linear shape.

6. The radio frequency (RF) coil array system of claim 1, wherein the first coil portion and the second coil portion each form a shape selected from a group consisting of: rectangular, square, circular, and polygonal shapes.

7. The radio frequency (RF) coil array system of claim 1, wherein the first radio frequency signals are set in order to match or have a same frequency value as the second radio frequency signals.

8. The radio frequency (RF) coil array system of claim 1, wherein the first radio frequency signals are set in order to have a different frequency value than the second radio frequency signals.

9. The radio frequency (RF) coil array system of claim 1, wherein each of the coil elements, of the plurality of coil elements, has a portion that is overlapped, with a portion of at least one other coil element, of the plurality of coil elements, in a manner that reduces induced signals resulting from a mutual inductance existing between adjacently located or positioned coil elements, of the plurality of coil elements.

10. The radio frequency (RF) coil array system of claim 1, wherein the first switch is electrically coupled between a first terminal of the first coil portion and a first terminal of the second coil portion, while the second switch is electrically coupled between a second terminal of the first coil portion and a second terminal of the second coil portion.

11. A magnetic resonance imaging (MRI) system, comprising:

a main magnet configured for generating a main magnetic field;
a gradient coil configured for applying gradient magnetic field onto the main magnetic field along selected gradient axes; and
an RF coil array assembly comprising:
a plurality of coil elements;
a first switch; and a
second switch physically built into each coil element, of the plurality of coil elements, such that a first loop capacitor is connected to the first switch at a first end of a second coil portion, while an impedance matching capacitor is connected to the second switch at a second end of the second coil portion;
wherein one terminal of the first loop capacitor is coupled to a first end of a first coil portion, along with one terminal of the impedance matching capacitor being coupled to a second end of the first coil portion, and
the RF coil array assembly being capable of being transformed in order to have a first coil configuration and a second coil configuration;
wherein in the first coil configuration, the first switch and the second switch are turned off in order to split each coil element, of the plurality of coil elements, into a first coil portion and a second coil portion, the first coil portion and the second coil portion of each coil element, in the plurality of coil elements, transmit first radio frequency signals, into a region of interest of a patient undergoing magnetic resonance imaging such that the region of interest of a patient undergoing magnetic resonance imaging is heated; and
wherein in the second coil configuration, the first switch and second switch are turned on in order to transform each coil element, in the plurality of coil elements, into a loop coil, and wherein the loop coils which are transformed from the plurality of coil elements in the second configuration are configured in order to simultaneously transmit or receive multiple second radio frequency signals, such that a temperature of the region of interest of a patient undergoing magnetic resonance imaging is detected with magnetic resonance imaging system.

12. The magnetic resonance imaging (MRI) system of claim 11, wherein in the first coil configuration, each of the coil elements comprises:
a first coil portion; and
a second coil portion;
with the first coil portion and the second coil portion forming a shape selected from a group consisting of: rectangular, square, circular, and polygonal shapes.

13. The magnetic resonance imaging (MRI) system of claim 11, wherein each coil element in the plurality of coil elements, further comprises:
the first loop capacitor being coupled in series with the first switch, whereby the first loop capacitor and the first switch are electrically coupled between a first end of the first coil portion and a first end of the second coil portion;
wherein when the first switch is turned on, the first end of the first coil portion is electrically coupled to the first end of the second coil portion via the first loop capacitor; and
wherein when the first switch is turned off, the first end of the first coil portion is electrically disconnected from the first end of the second coil portion.

14. The magnetic resonance imaging (MRI) system of claim 11, wherein each coil element in the plurality of coil elements, further comprises:
the impedance matching capacitor being coupled in series with the second switch, whereby the impedance matching capacitor and the second switch are electrically coupled between a second end of the first coil portion and a second end of the second coil portion;
wherein when the second switch is turned on, the second end of the first coil portion is electrically coupled to the second end of the second coil portion via the impedance matching capacitor; and
wherein when the second switch is turned off, the second end of the first coil portion is electrically disconnected from the second end of the second coil portion.

15. The magnetic resonance imaging (MRI) system of claim 11, wherein the first coil portion comprises:
a first sub-coil portion and a second sub-coil portion, while the second coil portion comprises:
a third sub-coil portion and a fourth sub-coil portion;
wherein each coil element, of the plurality of coil elements, further comprises:
a second loop capacitor electrically coupled between the first sub-coil portion and the second sub-coil portion; and
a third loop capacitor electrically coupled between the third sub-coil portion and the fourth sub-coil portion.

16. The magnetic resonance system of claim 11, wherein each of the coil elements, of the plurality of coil elements, has a portion that is overlapped, with a portion of at least one other coil element, of the plurality of coil elements, in a manner that reduces induced signals resulting from a mutual inductance existing between adjacently located or positioned coil elements, of the plurality of coil elements.

17. The magnetic resonance imaging (MRI) system of claim 11, wherein the first switch is electrically coupled between a first terminal of the first coil portion and a first terminal of the second coil portion, while the second switch is electrically coupled between a second terminal of the first coil portion and a second terminal of the second coil portion.

18. A method, of radio frequency (RF) temperature mapping with magnetic resonance imaging comprising:
switching off a first switch and a second switch of each coil element with a plurality of coil elements that are utilized by a magnetic resonance system in order to split each coil element, of the plurality of coil elements, into a first coil portion and a second coil portion;
wherein the first switch and the second switch are physically built into each coil element, of the plurality of coil elements, such that a first loop capacitor is connected to the first switch at a first end of a second coil portion; and
an impedance matching capacitor is connected to the second switch at a second end of the second RF coil portion;
wherein one terminal of the first loop capacitor is coupled to a first end of a first coil portion; and
one terminal of the impedance matching capacitor is coupled to a second end of the first coil portion;
transmitting a plurality of multi-channel first radio frequency (RF) signals from the first coil portion and the second coil portion of each coil element, of the plurality of coil elements, into a region of interest, in order to enable a heating of the region of interest based on an electric field interference that is being generated by the transmission of the plurality of multi-channel first radio frequency signals;
switching on the first switch and the second switch of each coil element, in the plurality of coil elements in order to transform each coil element, of the plurality of coil elements, into a loop coil; and
simultaneously transmitting or receiving a plurality of multi-channel second radio frequency signals from each of the loop coils that are formed by the plurality of coil elements in order to enable a temperature mapping of the heated region of interest with magnetic resonance imaging.

19. The method of claim 18, further comprising:
adjusting a phase and an amplitude of at least one of the multi-channel first radio frequency signals in order to heat another region of interest; and
repeating the step of simultaneously transmitting or receiving said multi-channel second radio frequency signals from each of the loop coils that are formed by the plurality of coil elements in order to enable a temperature mapping of the said another region of interest with magnetic resonance imaging.

20. The method of claim 18, wherein the first coil portion and the second coil portion, which are formed by switching off the first switch and the second switch of each coil element, in the plurality of coil elements, form a shape that is selected from a group consisting of: rectangular, square, circular, and polygonal shapes.

* * * * *